(12) United States Patent
Wilson et al.

(10) Patent No.: US 6,654,867 B2
(45) Date of Patent: Nov. 25, 2003

(54) METHOD AND SYSTEM TO PRE-FETCH COMPRESSED MEMORY BLOCKS USING POINTERS

(75) Inventors: Kenneth Mark Wilson, San Jose, CA (US); Robert Bruce Aglietti, San Jose, CA (US); Sumit Roy, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 295 days.

(21) Appl. No.: 09/864,036

(22) Filed: May 22, 2001

(65) Prior Publication Data

US 2002/0178332 A1 Nov. 28, 2002

(51) Int. Cl.[7] .............................................. G06F 9/38
(52) U.S. Cl. .......................... 711/213; 710/52; 710/68; 711/137; 711/150; 711/167; 711/170
(58) Field of Search ................................ 711/137, 150, 711/213, 170, 167, 173; 710/68, 52

(56) References Cited

U.S. PATENT DOCUMENTS

| | | | | |
|---|---|---|---|---|
| 5,150,462 A | * | 9/1992 | Takeda et al. | 345/555 |
| 6,266,091 B1 | * | 7/2001 | Saha et al. | 375/240.16 |
| 6,279,062 B1 | * | 8/2001 | Adiletta et al. | 710/68 |
| 6,310,918 B1 | * | 10/2001 | Saha et al. | 375/240.16 |
| 6,320,521 B1 | * | 11/2001 | Har et al. | 341/50 |
| 6,324,621 B2 | * | 11/2001 | Singh et al. | 711/129 |
| 6,415,280 B1 | * | 7/2002 | Farber et al. | 707/2 |
| 6,516,397 B2 | * | 2/2003 | Roy et al. | 711/170 |

* cited by examiner

Primary Examiner—T. V. Nguyen

(57) ABSTRACT

A method and system for parallel fetch and decompression of compressed data blocks is disclosed. A method first accesses a table of pointers specifying the location of compressed data to obtain a pointer. Using the pointer, the method reads a pointer in the first block of data, the pointer specifying the location of the next block of compressed data in a chain of compressed data blocks. The method also transfers the rest of the first compressed data block to be decompressed. The method then fetches the next compressed data block using the second pointer while decompressing the first compressed data block. Using a pointer in each successive compressed data block in the chain, the method pre-fetches the next compressed data block while the previous compressed data block is being decompressed.

19 Claims, 5 Drawing Sheets

METHOD AND SYSTEM TO PRE-FETCH COMPRESSED MEMORY BLOCKS USING POINTERS

TECHNICAL FIELD

The present invention relates to the field of computer memory management. Specifically, the present invention relates to a method and system for pre-fetching compressed memory blocks using pointers while decompressing a previously fetched block.

BACKGROUND ART

As the gap between hard drive access time and memory access time increases, it is increasingly desirable to locate more data in memory. This is increasingly important because the size of applications and data sets are increasing at a faster rate than the density of main memory. Furthermore, systems with multiprocessors may have many programs running simultaneously with each program having a relatively small number of pages of instructions and data in main memory. Hence, page faults may occur frequently. One way to increase the effective storage capacity of main memory is to compress the contents of main memory. However, conventional computer systems may be unable to efficiently manage the compressed data in main memory.

Because the compression ratio will vary from one page of data to the next, it is not known beforehand the resulting size of the compressed data. One conventional method uses compressed blocks of variable size, which may waste substantial memory. Moreover, this method uses garbage collection in the background, and hence consumes system resources. Another conventional system allows for compressed blocks of several different fixed sizes. For example, data which compressed down to a small size is placed in a small bucket and data which compressed down to a medium size is put in a medium size bucket, etc. However, there will still be space left over in each bucket. Furthermore, managing the multiple size buckets adds complexity.

Another conventional method for storing such compressed data is in small equal sized blocks. However, quickly retrieving such compressed data for decompression presents problems. One conventional method of accessing such compressed data is to construct a table with one entry for the compressed data corresponding to each uncompressed page. Each entry contains storage for pointers to the maximum number of compressed blocks possible. Furthermore, in order to avoid wasting space, the size of the multiple compressed blocks per uncompressed page is desirably kept small. Unfortunately, small compressed blocks means many blocks per uncompressed page, and hence this requires many pointers in the table. Alternatively, the size of the compressed blocks may be designed to be larger. While this may reduce the size of the table of pointers, larger compressed blocks leads to less efficient storage of compressed data.

Accordingly, it would be advantageous to provide a method and a system which allows a computer system to quickly read compressed data that is distributed by relatively small blocks within a memory system. A further need exists for a system which efficiently uses resources, such as the memory required for a table specifying the locations of the compressed data. A further need exists to be able to alter the size of the compressed data blocks. These and other advantages of the present invention will become apparent within discussions of the present invention herein.

DISCLOSURE OF THE INVENTION

The present invention provides for a method and system which allows a computer system to quickly read compressed data that is distributed in blocks within a memory system. Embodiments of the present invention efficiently use memory by minimizing the number of pointers placed in a table that is used to specify the location of compressed blocks of data. Embodiments further provide for a method and system for altering the size of compressed data blocks.

A method and system for parallel fetch and decompression of compressed data blocks is disclosed. In one method embodiment, the present invention recites accessing a table of pointers specifying the location of compressed data to obtain a pointer to a first block of compressed data. Using the pointer, the present embodiment recites reading a pointer in the first block of data and transferring the rest of the first compressed data block to be decompressed. The pointer in the first compressed data block specifies the location of the next block of compressed data in a chain of compressed data blocks. The present embodiment then recites pre-fetching the next compressed data block using the second pointer while decompressing the first compressed data block. Using a pointer in each successive compressed data block in the chain, the present embodiment recites pre-fetching the next compressed data block while the previous compressed data block is being decompressed.

Another embodiment provides for a way to decompress a plurality of data blocks chains which are formed from an uncompressed page which was divided before decompression. In this embodiment, there is a chain of compressed blocks for each division of the uncompressed page. The page table still requires only a single pointer to access each page of compressed data. When accessing the first block of compressed data, the present embodiment recites using a pointer in that block to find the next block in the chain. The present embodiment also recites adding an offset to the value of the pointer to the first block to locate a block at the head of another chain.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Figure 1:
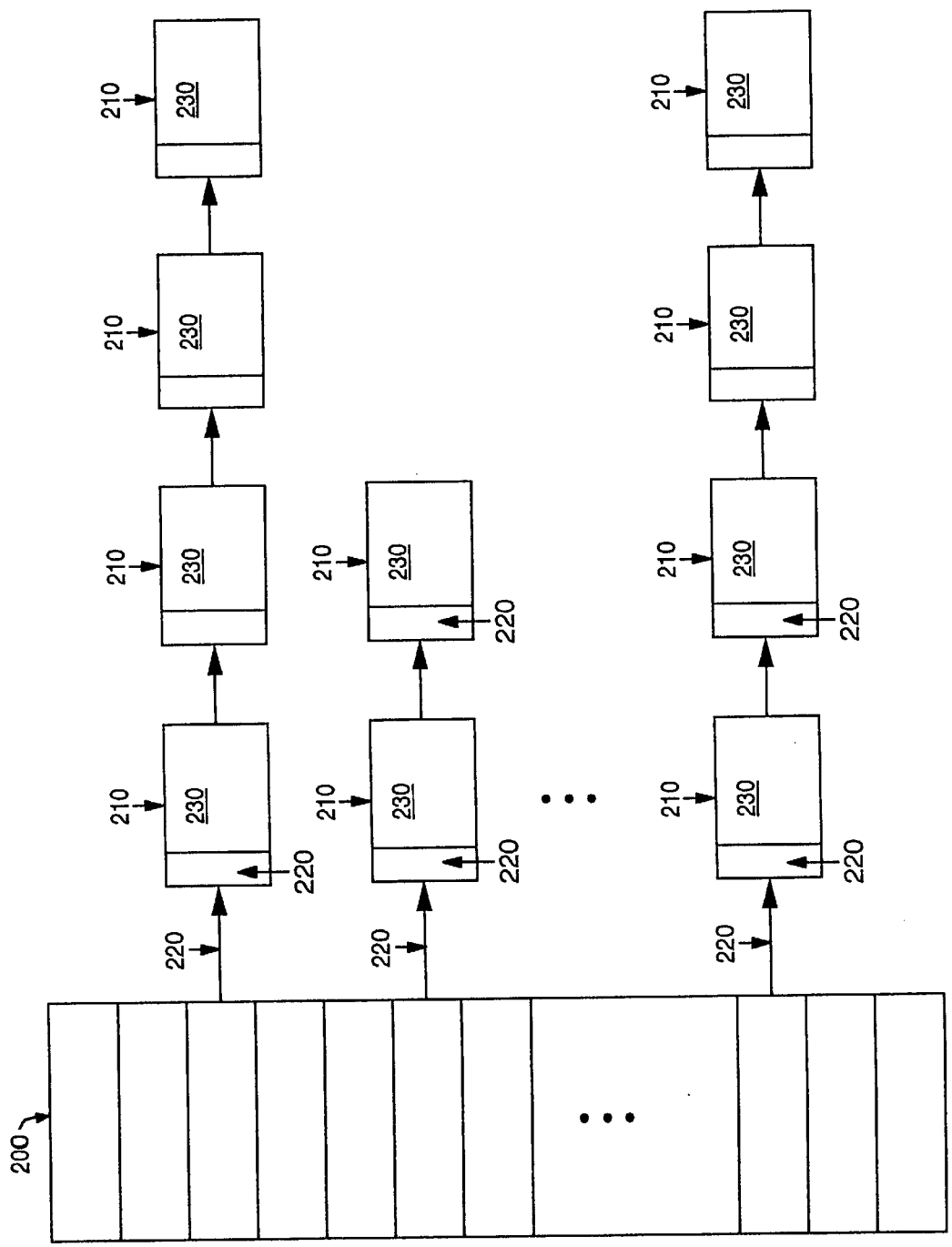
FIG. 1 is a diagram illustrating a table specifying the location of compressed data and chains of compressed data blocks, according to an embodiment of the present invention.

In the following detailed description of the present invention, numerous specific details are set forth in order to provide a thorough understanding of the present invention. However, it will be obvious to one skilled in the art that the present invention may be practiced without these specific details or by using alternate elements or methods. In other instances well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Pre-Fetching of Compressed Memory Blocks Using Pointers

The present invention comprises a table 200 which has an entry corresponding to each page of data which has been compressed. The table 200 contains a pointer 220 to the head of each chain of compressed data blocks 210. Each chain of compressed data blocks 210 contains the compressed data from a single page of uncompressed data, in this embodiment. Throughout this application the term block 210 may be defined as a group of bits or bytes of information of any suitable size. In one embodiment, the blocks 210 are of uniform size, for example, 512 bytes, 1 Kb, etc. However, the present invention is well suited to blocks 210 of non-uniform size. Whereas the data 230 in the blocks 210 are compressed, the pointer 220 itself is not. In this fashion, the pointer 220 may be used to pre-fetch the next block 210 in the chain while the previous block 210 is being decompressed. Rather than storing all the compressed data blocks 210 into a buffer before sending them to be decompressed, the compressed data blocks 210 are decompressed serially.

Figure 2:
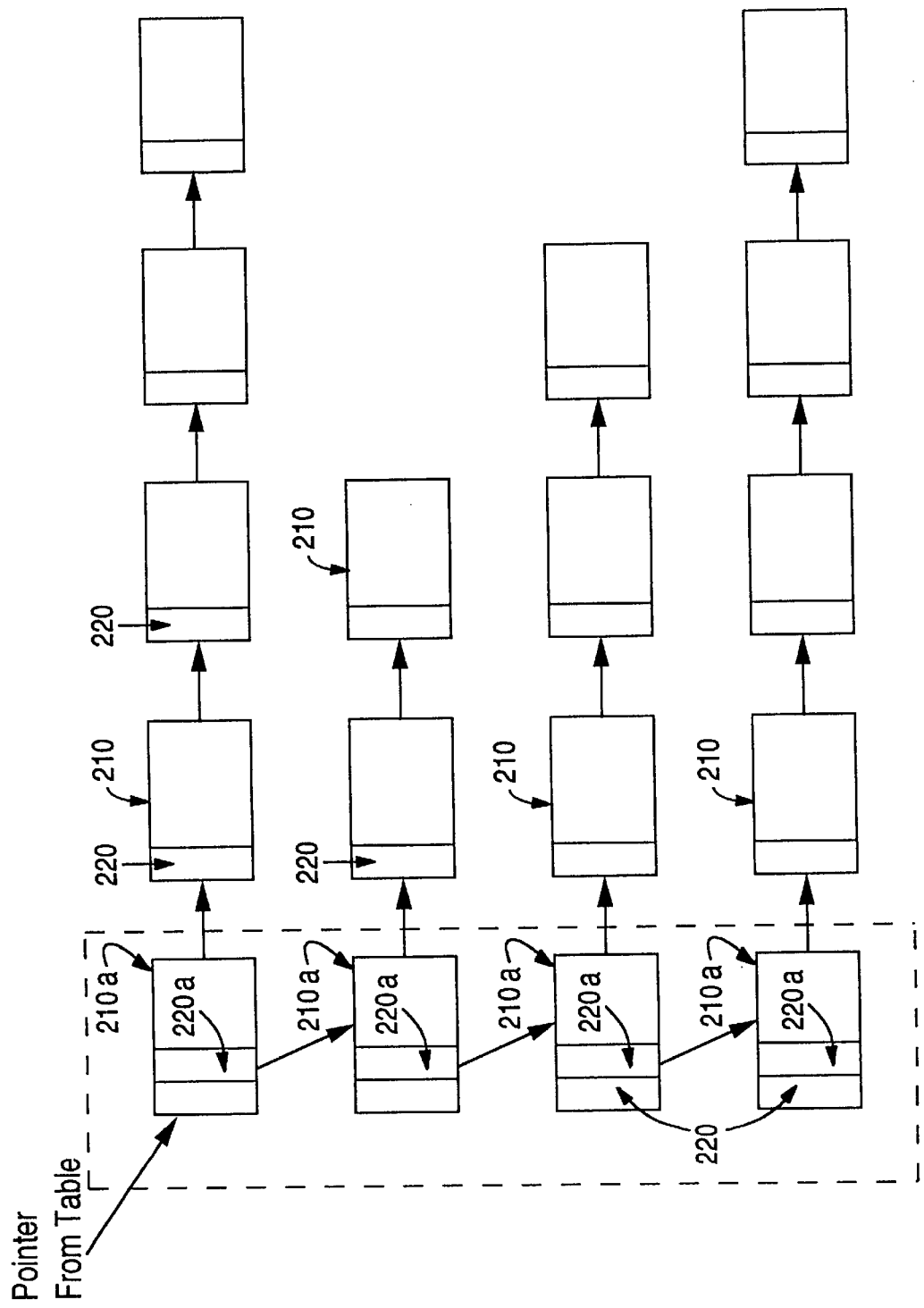
FIG. 2 is a diagram illustrating a number of chains of compressed data blocks, in accordance with an embodiment of the present invention.

In another embodiment, each page of uncompressed data is divided into sections before compressing it. Each section is stored as a separate chain of compressed data blocks 210. FIG. 2 illustrates four such chains of compressed data blocks 210 of non-uniform length, whose length depends on the compression ratio of the data. The chains are illustrated as a horizontal strings of compressed data blocks 210. The horizontal arrows connecting the compressed data blocks 210 represent pointers, which are general stored in the beginning of the blocks 210. In this embodiment, the table 200 still requires only one pointer 220 to the compressed data. For example, the table may have a single pointer 220 to the head 210a of one chain. The heads 210a of the other chains are located at known offsets from the head of that chain. In one embodiment, the chain heads 210a are located contiguously in memory and the size of the compressed data blocks 210 is known. Therefore, the appropriate offset is the size of the blocks compressed data 210. However, it is not required that the heads 210a be located contiguously. Advantageously, the other compressed data blocks 210 in all chains need not be located adjacent to any other compressed data block 210. In another embodiment, instead of using a known offset to locate each chain head 210a, additional pointers 220a are used. For example, each chain head 210a may have a second pointer 220a, which points to another chain head 210a. The arrows connecting the chain heads 210a represent these pointers 220a. Alternatively, multiple pointers (not shown) may be contained in a single chain head 210a.

Figure 3:
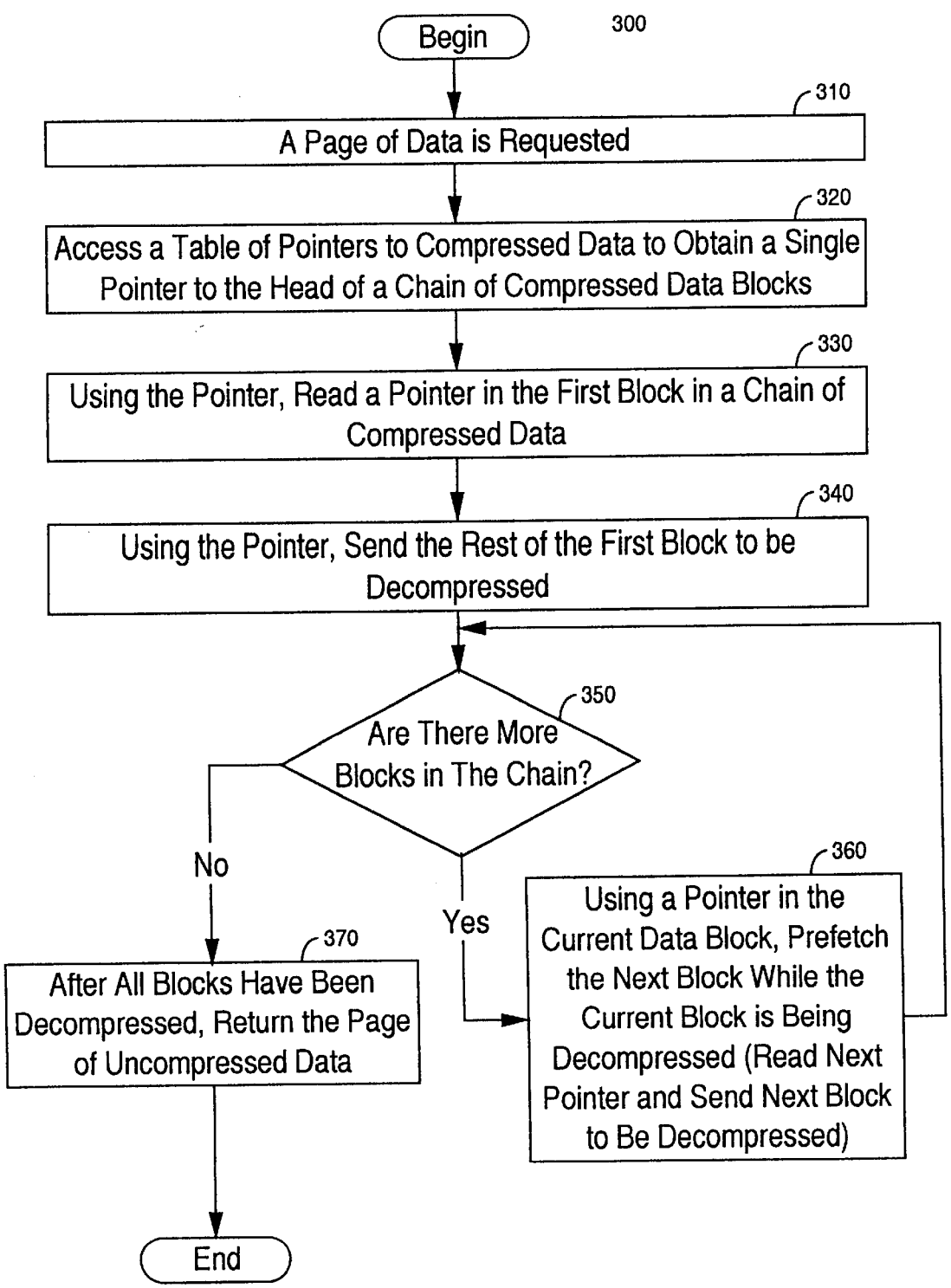
FIG. 3 is a flowchart illustrating the steps of a process of pre-fetching compressed data blocks while decompressing blocks, in accordance with embodiments of the present invention.

An embodiment of the present invention provides for a process 300 of pre-fetching compressed memory blocks 210 using pointers 220. Referring now to FIG. 3, the process 300 starts when a page of data is requested, in step 310. The requesting program may or may not have knowledge that the data is compressed. A method of allowing an operating system to have knowledge that the data is compressed is described in co-pending U.S. patent application Ser. No. 09/863988, concurrently filed herewith entitled, "Method and System Allowing a Single Entity to Manage Memory Comprising Compressed and Uncompressed Data", by Wilson et al., attorney docket number HP-10012210 and assigned to the assignee of the present invention, which is hereby incorporated by reference in its entirety.

Next, in step 320 the process 300 accesses the table 200 of pointers 220 specifying the location of the compressed data. A single pointer 220 is obtained to the head 210a of a chain of compressed data. The chain stores the compressed data for one page of uncompressed data, in one embodiment. However, in other embodiments, the chain of compressed data corresponds to other amounts of uncompressed data.

Next, in step 330, the process 300 fetches the head 210a of the chain of compressed data blocks 210 for the desired page, using the pointer 220 from the table 200. Because the pointer 220 in the compressed data block is read first, the retrieval of the next block 210 may be started when the first block 210 is still being processed. Thus, in step 340 the process 300 sends the rest of the first data block 210 (e.g., all but the pointer 220) to be decompressed.

In step 350, the process 300 determines if there are more compressed data blocks 210 in this chain, for example, by checking the pointer 220 in the present compressed data block 210.

If so, in parallel, the process 300 pre-fetches the next compressed data block 210 while the current compressed data block 210 is being decompressed, in step 360. In so doing, the process 300 reads the pointer 220 in the next compressed data block 210 and sends the rest of that block 210 to be decompressed. In this fashion, compressed data blocks 210 are decompressed serially. The process 300 repeats steps 350 and 360 until all compressed data blocks 210 in the chain have been sent for decompression. While parallel fetching and decompression is allowed, it is not required.

After all compressed blocks 210 have been decompressed and the page has been re-assembled, the page of data is returned, in step 370. By fetching individual blocks 210 in parallel, there is no delay in the decompression as long as the data from the next block 210 begins arriving at the de-compressor before the decompression of the previous block 210 is completed.

Figure 4:
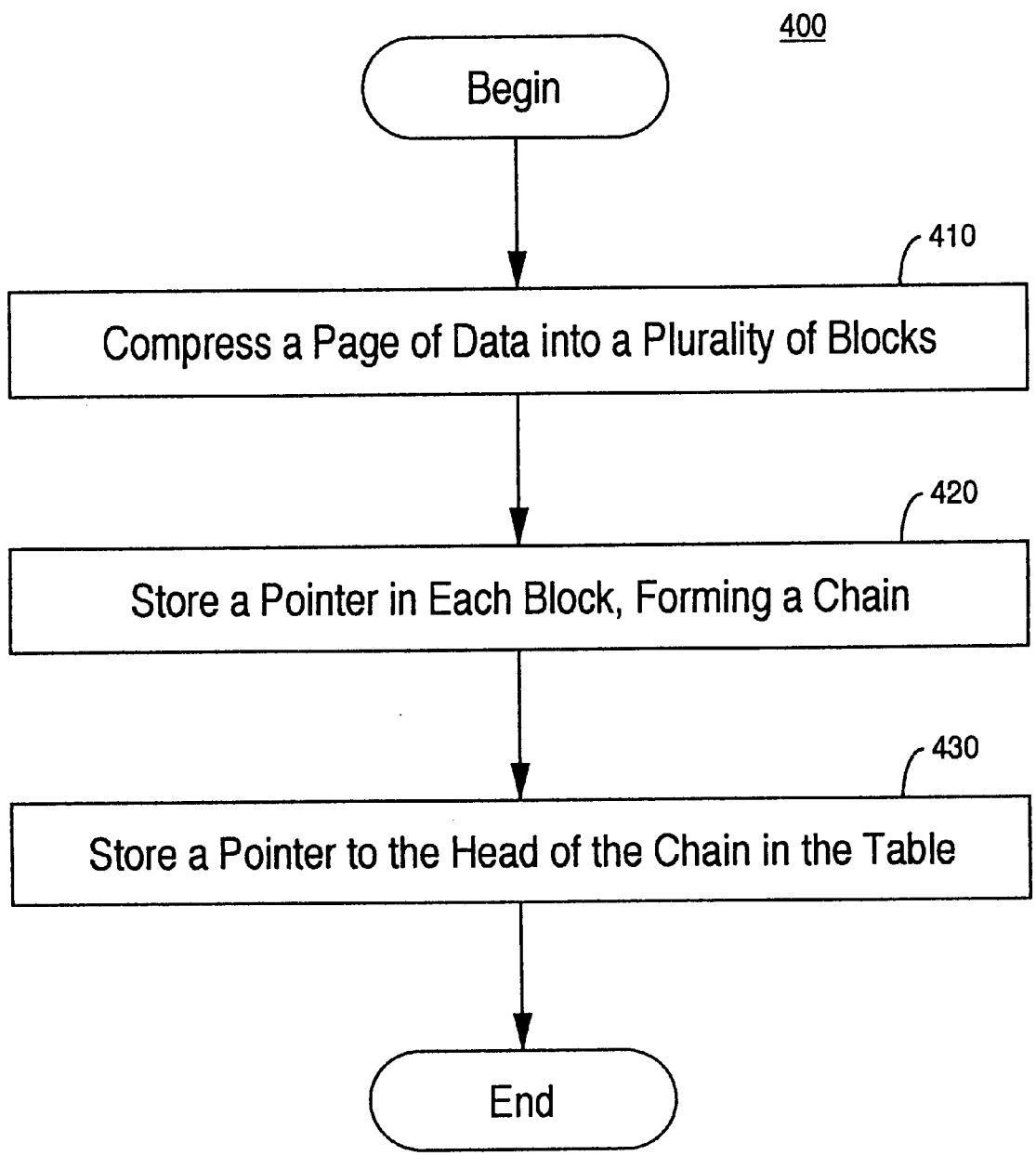
FIG. 4 is a flowchart illustrating the steps of a process of building the table and compressed data blocks, in accordance with embodiments of the present invention.

The flowchart of FIG. 4 illustrates the steps of a process 400 of building the table 200 and the chains of compressed data blocks 210. In step 410, the process 400 compresses a page of data into a number of compressed data blocks 210. The blocks 210 may be of any suitable size. Preferably, there will multiple blocks per page of uncompressed data.

Next, an uncompressed pointer 220 is stored in each compressed data block 210 such that a chain of compressed data blocks 210 is formed corresponding to the page of uncompressed data, in step 420.

Finally, in step 430, a pointer 220 to the head 210a of the chain is stored in the table 200. In this fashion, only a single pointer 220 is required per page of uncompressed data. It will be understood that a chain of compressed blocks 210 may correspond to uncompressed data other than a page, in other embodiments.

In another embodiment, in step 410 the page is first divided into a number of sections, each of which is compressed into its own set of compressed data blocks 210. In this case, the number of chains per uncompressed page will equal the number of sections per uncompressed page. However, there only one pointer 220 is required in the table 200 per page.

In one embodiment, the table 200 is implemented in software, in which case modifying the table 200 is relatively easy. For example, the number of pointers may be changed. In another embodiment, the configuration of the table 200 is built into hardware, wherein the number of pointers in the table 200 is fixed. While this may give conventional methods problems, embodiments of the present invention are able to adapt to changes such as the number of cuts into which a page is made before compression and the size of the compressed data blocks, regardless of whether the table is implemented in software or hardware. For example, if the size of the compressed data blocks 220 is reduced, the chains of compressed data blocks 220 may increase in length. However, the size of the table 200 need not increase, as the table 200 will require no more than one pointer 220 per page that has been compressed. Also, if number of sections into which a page is broken into before compression is modified, the number of chains of compressed data blocks 220 per page will change. However, this will not require a change to the table 200. In this case, the software managing the compressed memory may have an adjustable parameter which defines how many chains exist per page.

Figure 5:
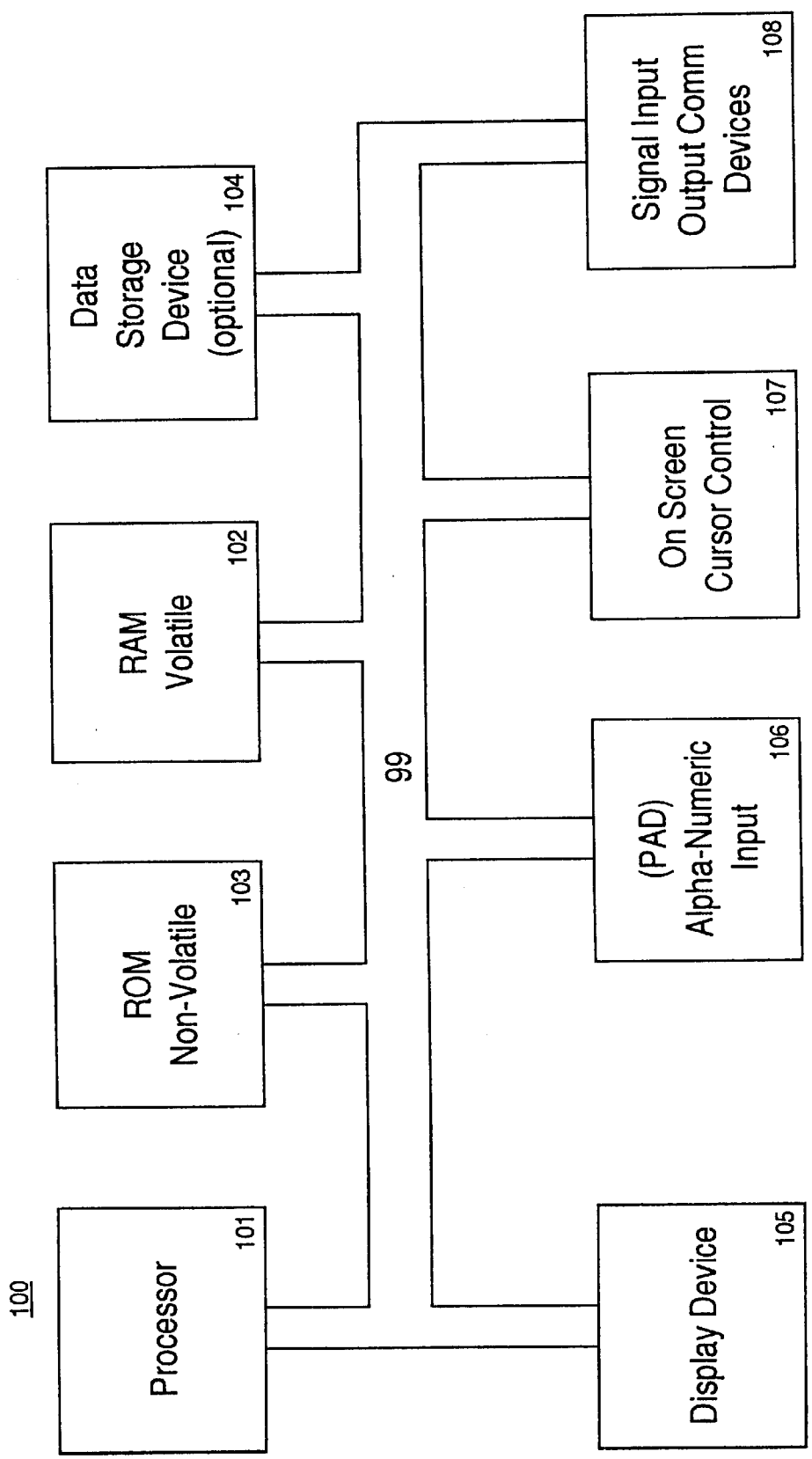
FIG. 5 is a schematic of a computer system, which may be used to implement embodiments of the present invention.

FIG. 5 illustrates circuitry of computer system 100, which may form a platform for embodiments of the present invention. Computer system 100 includes an address/data bus 99 for communicating information, a central processor 101 coupled with the bus 99 for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 5, system 100 of the present invention also includes an optional alphanumeric input device 106 including alphanumeric and function keys is coupled to bus 99 for communicating information and command selections to central processor unit 101. System 100 also optionally includes a cursor control device 107 coupled to bus 99 for communicating user input information and command selections to central processor unit 101. System 100 of the present embodiment also includes an optional display device 105 coupled to bus 99 for displaying information. A signal input/output communication device 108 coupled to bus 99 provides communication with external devices.

The preferred embodiment of the present invention, a method and system for pre-fetching compressed data blocks, is thus described. While the present invention has been described in particular embodiments, it should be appreciated that the present invention should not be construed as limited by such embodiments, but rather construed according to the below claims.

What is claimed is:

1. A method of accessing compressed data, said method comprising the steps of:
    a) accessing a table of pointers specifying the location of compressed data to obtain a first pointer to a first compressed data block;
    b) reading in said first compressed data block a second pointer, said second pointer specifying the location of a second compressed data block in a first chain of compressed data blocks;
    c) using said first pointer, transferring the rest of said first compressed data block to be decompressed;
    d) fetching said second compressed data block using said second pointer while decompressing said first compressed data block; and
    e) using a pointer in each successive compressed data block in said chain, pre-fetching the next compressed data block while the previous compressed data block is being decompressed.

2. A method as described in claim 1 further comprising the step of:
    f) adding an offset to said first pointer to determine the location of a second chain of compressed data.

3. A method as described in claim 1 further comprising the steps of:
    f) reading in said first compressed data block a third pointer; and
    g) using said third pointer, locating a second chain of compressed data blocks.

4. A method as described in claim 1 further comprising the steps of:
    f) compressing a page of uncompressed data into a plurality of compressed data blocks;
    g) storing pointers in said plurality of compressed data blocks to form a second chain; and
    h) storing in said table a third pointer, said third pointer indicating the location of said second chain.

5. A method as described in claim 1 further comprising the steps of:
    f) dividing a page of uncompressed data into a plurality of sections;

g) compressing each said section into a plurality of compressed data blocks; and h) forming a plurality of chains corresponding to said plurality of sections by storing pointers in said plurality of compressed data blocks; and i) storing in said table a third pointer to one chain of said plurality of chains.

6. A method as described in claim 5 further comprising the steps of:

j) using software, modifying the number of sections into which pages are cut; and k) repeating said steps f) through i).

7. A system for managing memory, said system comprising:

a plurality of chains of compressed data blocks, said compressed data blocks having pointers to form said plurality of chains of compressed data blocks; and a table comprising a plurality of pointers, each of said plurality of pointers specifying the location of a first block in one of said plurality of chains of compressed data blocks;

wherein said pointers in said compressed data blocks are not compressed, and wherein said system is operable to pre-fetch the next compressed data block in a chain of said plurality of chains without decompressing the pointer from a previous compressed data block while the previous compressed data block is being decompressed.

8. The system of claim 7 wherein:

each chain of said plurality of chains comprises compressed data from a page of uncompressed data.

9. The system of claim 7 wherein each page of uncompressed data is compressed into a single chain of blocks of compressed data.

10. The system of claim 7 wherein the length of said plurality of chains is non-uniform.

11. The system of claim 7 wherein:

the configuration of said table of said plurality of pointers is configured by hardware, wherein the number of said plurality of pointers is fixed.

12. The system of claim 7 wherein said plurality of blocks of compressed data are of uniform size.

13. The system of claim 7 wherein said plurality of blocks of compressed data are of non-uniform size.

14. The system of claim 7 wherein:

each page of uncompressed data is compressed into multiple chains of compressed data blocks;

a pointer to one chain of said multiple is stored in said table; and at least one head of a chain of said multiple comprises a pointer to the head of at least one other chain.

15. A computer readable medium having stored thereon program instructions for implementing a method for accessing compressed data, said method comprising the steps of:

a) accessing a table of pointers specifying the location of compressed data to obtain a first pointer to a first compressed data block;

b) reading a second pointer in said first compressed data block, said second pointer specifying the location of a second compressed data block in a first chain of compressed data blocks;

c) using said first pointer, transferring the rest of said first compressed data block to be decompressed;

d) fetching said second compressed data block using said second pointer while decompressing said first compressed data block; and e) using a pointer in each successive compressed data block in said chain, pre-fetching the next compressed data block while the previous compressed data block is being decompressed until said first chain of compressed data blocks ends.

16. A method as described in claim 15 further comprising the step of:

f) adding an offset to said first pointer to determine the location of a second chain of compressed data.

17. A method as described in claim 15 wherein said step a) comprises the step of:

a1) in response to a request for a page of data, locating said first pointer in said table, wherein said first pointer indicates the location of the compressed data corresponding to said page of data.

18. A method as described in claim 15 further comprising the step of:

f) wherein said first chain of data blocks are decompressed to form a page of uncompressed data.

19. A system for managing memory, said system comprising:

a plurality of chains of compressed data blocks, said compressed data blocks having pointers to form said plurality of chains of compressed data blocks; and a table comprising a plurality of pointers, each of said plurality of pointers specifying the location of a first block in one of said plurality of chains of compressed data blocks; wherein:

each page of uncompressed data is compressed into multiple chains of compressed data blocks;

a pointer to one chain of said multiple is stored in said table; and the head of each chain of said multiple is stored with known offsets in memory, and wherein said system is operable to access the rest of said multiple chains by adding a known offset to said pointer to said one chain of said multiple chains.

* * * * *